(12) United States Patent
Kozlov et al.

(10) Patent No.: US 9,024,636 B2
(45) Date of Patent: May 5, 2015

(54) METHOD FOR OPTIMIZATION OF A MULTI-CHANNEL COIL

(75) Inventors: Mikhail Kozlov, Dresden (DE); Robert Turner, Leipzig (DE)

(73) Assignee: Max-Planck-Gesellschaft zur Foerderung der Wissenschaften e.V., Munich (DE)

(*) Notice: Subject to any disclaimer, the term of this patent is extended or adjusted under 35 U.S.C. 154(b) by 366 days.

(21) Appl. No.: 13/391,299

(22) PCT Filed: Sep. 8, 2009

(86) PCT No.: PCT/EP2009/006514
§ 371 (c)(1),
(2), (4) Date: Feb. 20, 2012

(87) PCT Pub. No.: WO2011/029452
PCT Pub. Date: Mar. 17, 2011

(65) Prior Publication Data
US 2012/0153951 A1 Jun. 21, 2012

(51) Int. Cl.
*G01R 33/3415* (2006.01)
*G01R 33/36* (2006.01)
*G01R 33/565* (2006.01)

(52) U.S. Cl.
CPC ........ *G01R 33/3628* (2013.01); *G01R 33/3415* (2013.01); *G01R 33/3642* (2013.01); *G01R 33/5659* (2013.01)

(58) Field of Classification Search
CPC ........... G01R 33/3628; G01R 33/3415; G01R 33/3642; G01R 33/5659; G01R 33/441; G01R 33/365; G01R 33/34046
See application file for complete search history.

(56) References Cited

U.S. PATENT DOCUMENTS

| 5,208,537 | A |   | 5/1993 | Rietsch et al. | |
| 5,461,314 | A | * | 10/1995 | Arakawa et al. | 324/318 |
| 5,483,158 | A | * | 1/1996 | van Heteren et al. | 324/318 |
| 5,592,083 | A | * | 1/1997 | Magnuson et al. | 324/300 |
| 5,594,338 | A | * | 1/1997 | Magnuson | 324/318 |
| 5,986,455 | A | * | 11/1999 | Magnuson | 324/318 |
| 6,194,898 | B1 | * | 2/2001 | Magnuson et al. | 324/300 |

(Continued)

OTHER PUBLICATIONS

Alagappan, et al., "An 8 Channel Transmit Coil for Transmit Sense at 3T", Proc. Intl. Soc. Mag. Reson. Med., vol. 14, p. 121 (2006).

(Continued)

*Primary Examiner* — Dixomara Vargas
(74) *Attorney, Agent, or Firm* — Caesar Rivise, PC

(57) ABSTRACT

The invention relates to a method for optimization of the performance of a multi-channel coil (1) comprising at least three coil elements, wherein the method comprises the following steps: a) Exciting the coil elements of the multi-channel coil (1) by electrical power signals comprising a specific power, wherein the power of the power signals is partially reflected by the coil elements of the multi-channel coil (1), b) Measuring the power which is reflected by the individual coil elements of the multi-channel coil (1) or by the entire multi-channel coil (1) during excitation of the coil elements, c) Tuning the multi-channel coil (1) depending on the measured reflected power so that the performance of the multi-channel coil (1) is improved, wherein d) all coil elements of the multi-channel coil (1) are simultaneously excited, and e) the reflected power is measured during the simultaneous excitation of all coil elements of the multi-channel coil (1).

17 Claims, 14 Drawing Sheets

(56) References Cited

U.S. PATENT DOCUMENTS

| | | | |
|---|---|---|---|
| 6,291,994 B1* | 9/2001 | Kim et al. | 324/300 |
| 7,336,074 B2* | 2/2008 | Yang et al. | 324/318 |
| 7,642,782 B2* | 1/2010 | Vernickel et al. | 324/322 |
| 7,800,368 B2* | 9/2010 | Vaughan et al. | 324/318 |
| 8,525,370 B2* | 9/2013 | Walley et al. | 307/104 |
| 8,729,895 B2* | 5/2014 | Freytag | 324/307 |
| 2012/0112748 A1* | 5/2012 | Hetherington et al. | 324/318 |

OTHER PUBLICATIONS

Kozlov et al., "A reliable method for calculating RF coil performance", Proc. Intl. Soc. Mag. Reson. Med., vol. 17, p. 3016 (2009).

Kozlov et al., "Fast MRI coil analysis based on 3-D electromagnetic and RF circuit co-simulation", Journal of Magnetic Resonance, vol. 200, pp. 147-152 (2009).

Kozlov et al., "Performance optimization of a multi-channel transmit coil with significant coupling between elements", Proc. Intl. Soc. Mag. Reson. Med., vol. 17, p. 4765 (2009).

Roemer et al., "The NMR Phased Array", Magnetic Resonance in Medicine, vol. 16, pp. 192-225 (1990).

Stang et al., "A Versatile In-Line Sensor for Power Monitoring and Calibration of Transmit Arrays", Proc. Intl. Soc. Mag. Reson. Med, vol. 17, p. 3024 (2009).

Wang, "A Novel Method to Reduce the Signal Coupling of Surface Coils for MRI", Proc. Intl. Soc. Mag. Reson. Med., vol. 4, p. 1434 (1996).

International Search Report for PCT/EP2009/006514 dated Dec. 23, 2009.

* cited by examiner

METHOD FOR OPTIMIZATION OF A MULTI-CHANNEL COIL

FIELD OF THE INVENTION

The present invention relates to a method for performance optimization of multi-channel (multi-input) near-field radio frequency (RF) coils, in particular to the tuning of a magnetic resonance imaging (MRI) multi-channel transmit coil. Furthermore, the invention relates to the control or investigation of MRI multi-channel coil performance when RF shimming is attempted. Preferred applications of the invention are in the areas of MRI coil design, fabrication, and on-site tuning.

BACKGROUND OF THE INVENTION

The main MRI applications are in the field of medical imaging. It is important to provide the best RF coil performance—the highest RF magnetic field per unit power delivered to the coil, while simultaneously obtaining the highest RF field homogeneity—in order to obtain fast and reliable MR images of a patient or volunteer subject.

For magnetic resonance imaging (MRI), especially at high magnetic field level, it has become important to use a multi-channel transmit coil for producing the desired RF field. The coil can be excited by a single channel transmit power source followed by a multi-channel power splitter, or by a multi-channel power transmitter unit. Due to the natural geometrical electromagnetic (EM) interaction, it is impossible to design a multi-channel coil without EM coupling of its elements. In a first approximation this EM coupling can be characterized by the S parameter coefficients $S_{xy}$ where x and y correspond to coil element input numbers.

Several EM coupling compensation methods have been proposed to address the problem.

One category of methods introduces partial geometric overlap of coil elements to annul the mutual inductance between them (cf. ROEMER P B, EDELSTEIN W A, HAYES C E, SOUZA S P, MUELLER O M.: "The NMR phased array", Magn Reson Med 1990, 16:192-225; ALAGAPPAN V, WIGGINS G, POTTHAST A, SETSOMPOP K, ADALSTEINSSON E, WALD L.: "An 8 channel transmit coil for transmit SENSE at 3 T", Proceedings of the 14th Annual Meeting of ISMRM, Seattle, Wash., USA, 2006). Such methods are effective for nearest-neighbor elements only, and tend to impose stringent constraints on the geometry and placement of the individual coils.

Another category of methods employs a capacitive, inductive or a multi-port decoupling network at the cost of increased RF loss and increased complexity of the decoupling circuits and tuning efforts (cf. "The NMR phased array", l.c.; "An 8 channel transmit coil for transmit SENSE at 3 T", l.c.; WANG J.: "A novel method to reduce the signal coupling of surface coils for MRI. In: Proceedings of the 4th Annual Meeting of ISMRM, New York, N.Y., USA, 1996).

A third category of methods suppresses the coupling-induced currents with high source impedance, for example, driving non-resonant loop-shaped coils directly by power metallic oxide semiconductor field effect transistors (cf. "The NMR phased array", l.c.). However this technology has not been implemented in commercial available MRI scanner yet.

The major challenge in multi-channel coil design consists in the difficulty (or in most cases impossibility) of designing a solution in which the EM coupling compensation performance is independent of coil loading. In addition, for relatively high frequency coils where the RF wavelength in the load is comparable or less than the coil element length, the electromagnetic coupling becomes spatially distributed. As a result, such coupling (defined here as distributed EM coupling, as opposed to lumped EM coupling as found in low frequency coils) cannot be described using only lumped element theory, it cannot be estimated explicitly as a value for $S_{xy}$, and it cannot be fully compensated using approaches derived from lumped element based analysis.

By considering power balance, it is clear that a coil's magnetic field approaches a maximum when the RF power reflected by the entire coil ($P_{Ref, Coil}$) approaches its minimum at the MRI resonance frequency ($f_{res}$) (cf. "The NMR phased array", l.c.). However, there is no standardized commercial device for measuring $P_{Ref, Coil}$ of multi-channel near-field RF coils that can be used for its minimization. The most common RF coil tuning procedure is the minimization of each element's reflection coefficient ($S_{xx}$). This usually entails that the $S_{xx}$ of each element approaches its minimum at a frequency ($f_{min, Sxx}$) equal to $f_{res}$. $S_{xx}$ is measured by direct connection of a vector network analyzer (VNA) to each coil element's input while the other elements are terminated simultaneously by 50 Ohm loads. This works reliably when the difference of the frequencies at which $S_{xx}$ and $P_{Ref, Coil}$ approach their minimum is significantly smaller than the ratio of $f_{res}$ to loaded coil quality factor ($Q_{coil}$). It is valid for coils with a moderate number of elements, lumped EM coupling and when both $S_{xx}$ and $S_{xy}$ are lower than −20 dB. The higher the $S_{xy}$ value and the larger the number of coil elements, the larger the difference in frequency at which $S_{xx}$ and $P_{Ref, Coil}$ approach their minimum. This occurs because for a multi-channel coil $P_{Ref, Coil}$ depends not only on the $S_{xx}$ and $S_{xy}$ magnitudes but also on the phase distribution both of $S_{xy}$ and the power delivered to each coil element.

Another approach for optimization of multi-channel coil performance is to maximize the magnetic field generated by individual elements (cf. "The NMR phased array", l.c.). However, as with the $S_{xx}$ minimization strategy, the higher the $S_{xy}$ value and the larger the number of coil elements, the larger the difference between the frequencies at which the magnetic field of an individual coil element approaches its maximum and $P_{Ref, Coil}$ approaches its minimum.

For distributed EM coupling there is no simple criterion useful for estimation when the difference of the frequencies at which $S_{xx}$ and $P_{Ref, Coil}$ approach their minimum becomes considerable. As a result it is impossible to predict in advance that coil performance optimization guided by $S_{xx}$ and $S_{xy}$ will succeed.

Direct $P_{Ref, Coil}$ minimization yields a simple method for achieving the maximum near-field magnetic field generated for unit delivered power. In general, $P_{Ref, Coil}$ can be calculated by obtaining the full S parameter matrix of a coil (where the number of unknowns is equal to the square of the number of coil elements), together with knowledge of the power amplitude and phase delivered to each port input. Measuring of the full S parameter matrix for a multi-channel coil is a rather time consuming process. After each tuning/matching step, as well as for any movement of the coil load, the S parameter matrix has to be redefined. This makes such experimental coil optimization procedure extremely complex and unsuitable for real applications.

In additional, for coils using a power splitter, it is difficult to obtain the amplitude and phase distribution by means of an NVA measurement of the power delivered to each coil element by each splitter channel, because the phase distribution depends on coil input impedance, which is never exactly 50 Ohm, and in general varies with coil loading and tuning conditions.

It is not obligatory to compensate EM coupling completely during coil performance optimization. By adjusting the RF coil tuning and matching sub-circuits, a condition can be achieved where some RF coils are suitable for MRI purposes, although they lack distributed or lumped EM coupling compensation, or have residual uncompensated EM coupling despite use of a decoupling method. The performance of such coils can remain close to that achievable with the best reachable coupling compensation. We define EM coupling condition in such coils as weak and in other coil types as strong.

This is not merely an academic issue, since some commercial available multi channel coils are built and marketed without any coupling compensation at all (cf. "The NMR phased array", l.c.).

Several methods have been developed to assist optimization of RF coil homogeneity. One of these is a so-called RF shimming procedure, which can be applied with multi-channel RF coils to improve RF field homogeneity in the object region to be investigated (region of interest, ROI). Adjustment of the amplitude and phase of transmit signals for each individual coil element eliminates the imperfections of near-field coil performance within an ROI that is in most cases much smaller than the entire coil load volume, simultaneously influencing $P_{Ref, Coil}$ and coil performance, as a result. Because the maximum value of power delivered to each coil input is limited by the available hardware, it is impossible without limit to increase input power to compensate for degraded coil performance. Thus, for MRI techniques involving adjustment of the amplitude and phase of transmit signals, the coil tuning/matching condition must be optimized for best performance within the range of amplitudes and phases provided.

There are several approaches for measurement of power reflected from a single RF coil input. A commonly used method involves installing a RF coupler in front of the RF coil input and measuring coupler output signal by an oscilloscope or a power meter. Additionally, recent developments have made available a versatile transmit path monitor using an in-line vector RF current and voltage (I/V) sensor connected to a digital console (cf. "The NMR phased array", l.c.).

SUMMARY OF THE INVENTION

It is an objective of the present invention to provide a reliable and relatively fast method for performance optimization of a multi-channel coil based on direct minimization of $P_{Ref, Coil}$ at $f_{res}$. In particular, it is an objective of the invention to provide such a method that can be used in both experimental and numerical domains in the same way, to offer close agreement.

A further objective of the invention is to provide a method to control RF array coil performance when RF shimming is used.

These objectives are solved with methods and devices as defined in the independent claims. Advantageous embodiments and applications of the invention are defined in the dependent claims.

According to the first aspect of the invention, a method is provided for performance optimization of a multi-channel near-field RF coil, which is simultaneously excited by at least two power signals with fixed amplitude and phase. In this method, performance optimization is achieved by direct minimization of $P_{Ref, Coil}$ at $f_{res}$. For this purpose the power supply (power supplies in multi-transmit case) is connected to the coil input, as during MRI operation, and at least one reflected power measurement device (single component or a system) is installed between the coil element power signal source and the coil element input (defined at the point of feed sub-circuit input). The insertion impedance of the measurement device must be significantly less than the input impedance of the coil element to eliminate the effect of losses in the measuring device on coil performance. To reduce error related to imprecise reflected power measurement, such a device must be calibrated in advance, for example, by measuring reflected power when the coil input investigated is substituted by a 50 Ohm load. Using reflected power measurement devices sequentially (or in parallel when an appropriate device is available) reflected power measurements for each coil element are obtained. The sum of these measurements over all elements is $P_{Ref, Coil}$, the power reflected by the entire coil.

The inventive step utilizes the fact that the power reflected by the entire coil depends on the values of the adjustable and replaceable coil components (including EM coupling compensation components). By changing these values, $P_{Ref, Coil}$ can be straightforwardly minimized.

As a main advantage, use of this inventive method for $P_{Ref, Coil}$ guided performance optimization of a multi-channel near-field RF coil requires much less measurement effort, as compared with full S-parameter matrix measurement. The inventive method requires measurement of the power reflected by each coil input as a scalar quantity, in contrast with the much more complex vector based measuring technique required for full S parameter matrix measurement. This simplicity ensures more precise $P_{Ref, Coil}$ estimation, and makes $P_{Ref, Coil}$ guided performance optimization of a multi-channel near-field RF coil suitable for real applications. As the preferred application of the invention, MRI multi-channel coil performance optimization (tuning) is guided by measurements providing reflected power both for individual elements and for the entire coil, under conditions of real usage of the coil in MRI operation. Advantageously, the inventive method is insensitive to the load dependence of the coil performance. Coil performance can be easily optimized for each load. If tuning cannot be performed on-site due to safety issues, the coil performance can be pre-optimized, taking in account a set of expected load conditions.

According to the second aspect of the invention, a method is provided for performance optimization of a multi-channel near-field RF coil, which is excited by at least two power signals with amplitude and phase that are varied in time (for example transmit SENSE or slice dependent RF shimming). As the first step, the coil is tuned experimentally to obtain the minimum $P_{Ref, Coil}$ for nominal input power amplitude and phase corresponding to the mode of coil operation (for example circular polarization mode) as described in the first aspect of the invention. As the second step, the coil, with tune and feed condition thus derived, is analyzed by a Monte Carlo approach experimentally to obtain the dependence of $P_{Ref, Coil}$ on the amplitude and phase of the voltage applied to each input of the coil. The required range of amplitude and phase deviation from nominal values is based on the transmit application requirements. If the histogram profiles show that there is essential difference between performances for the most frequent combinations of input power amplitude and phase and for nominal input power amplitude and phase, then the coil should be retuned using one of the most frequent combinations of input power amplitude and phase as nominal condition to achieve the best average performance.

DETAILED DESCRIPTION OF THE DRAWINGS

Figure 1:
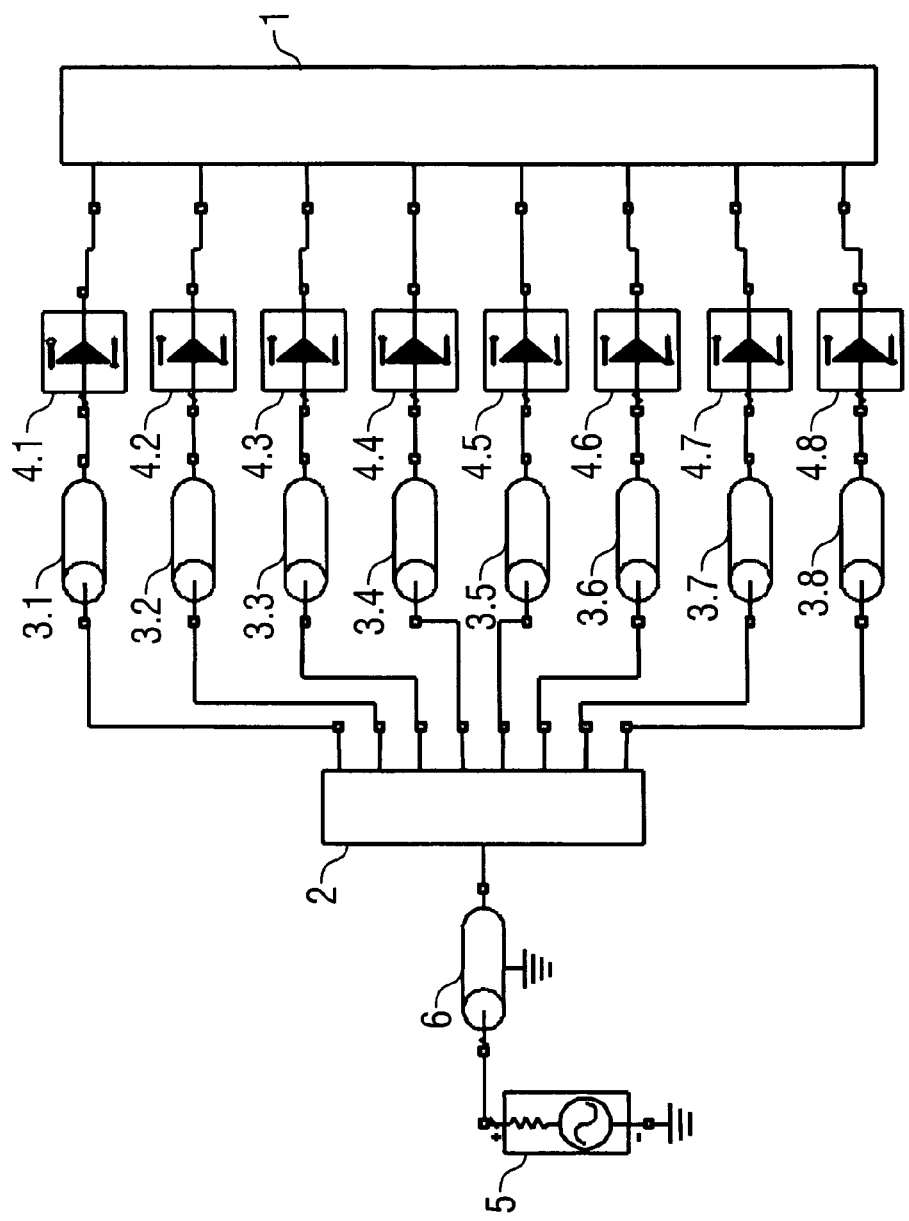
FIG. 1 shows a diagram of an arrangement for optimization of an 8-channel MRI coil.

Preferred embodiments of the invention are described in the following with reference to performance optimization of multi-channel (multi-input) near-field RF coils, in particular to the tuning of a MRI multi-channel transmit coil 1. Details of transmit coil design and assembly, positioning of the coil within an MR scanner, as well as control of an network analyzer and details of an MR scanner are not described, since they are known from prior art in the field of MRI.
The Method for Performance Optimization of Multi-Channel (Multi-Input) Near-Field Radio Frequency (RF) Coils The essential step of the inventive performance optimization method is the measurement of the power reflected by each individual input, and as a result the power reflected by the entire coil 1, when all coil inputs are excited by voltages with nominal specified amplitude and phase. In the following, the technical basis of this inventive method is described. Reference is made to FIG. 1, which schematically illustrates the optimization setup for an 8-channel MRI coil 1 with a power splitter 2, phase shifters 3.1-3.8, bi-directional couplers 4.1-4.8, a power supply 5 and a transmission line 6 between the power source 5 and the splitter 2.

After the MRI coil 1 is assembled, and loaded by a phantom or a subject, the power supply 5, in this case the power outputs of a network analyzer, is connected to the coil input as during MRI operation, and eight reflected power measurement devices (in our case the eight bi-directional couplers 4.1-4.8) are installed between each coil element power signal source and the correspondent coil element inputs. The outputs of the bi-directional couplers 4.1-4.8 are connected to a power measurement device (not shown), in this case to the receiver channels of a network analyzer. In general, the scanner power supply, which provides power at safe levels for the given coil load, and the scanner receiver channels, constituting the power measurement device, can be used for the inventive method. The network analyzer is programmed to provide a frequency sweep, at frequencies around the MRI coil operation frequency (frequencies in case of multi-nuclear MRI coil), of the ratios between $P_{Ref, Coil}$ and transmitted power ($P_{trans, coil}$), as well as each element's input reflected power and nominal (expected) transmitted power ($P_{trans, elem}$) for each element's input ($P_{ref, elem}$). This provides visual data for the minimization procedure.

Sequential minimization of each element's input reflected power at $f_{res}$ is a simple and feasible approach for minimization of $P_{Ref, Coil}$ at $f_{res}$. In general this is very similar to the $S_{xx}$ based tuning/matching procedure. As a result, all the available knowledge and experience of $S_{xx}$ based tuning/matching algorithms can be used for fast and reliable minimization of $P_{Ref, Coil}$ at $f_{res}$. For direct comparison with $S_{xx}$ in "db" level, quantities $P_{Ref, Coil}$ and $P_{ref, elem}$ can be represent as db($\sqrt{(P_{Ref, Coil}/P_{trans, coil})}$) and ($\sqrt{(P_{ref, elem}/P_{trans, elem})}$) correspondingly.

Figure 2:
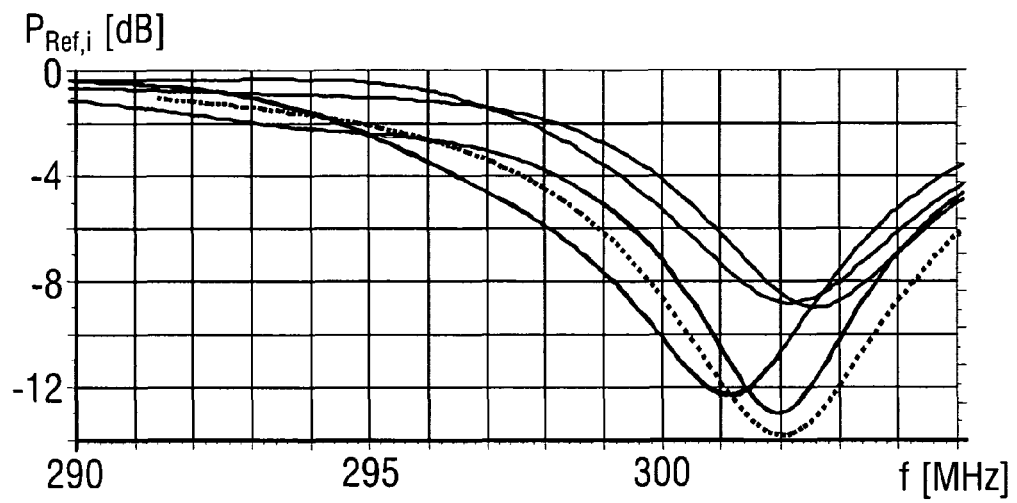
FIG. 2 shows the characteristics of the reflected power $P_{Ref,i}$ of each coil element of the MRI coil with an equal value of all tuning capacitors of the MRI coil.
Figure 3:
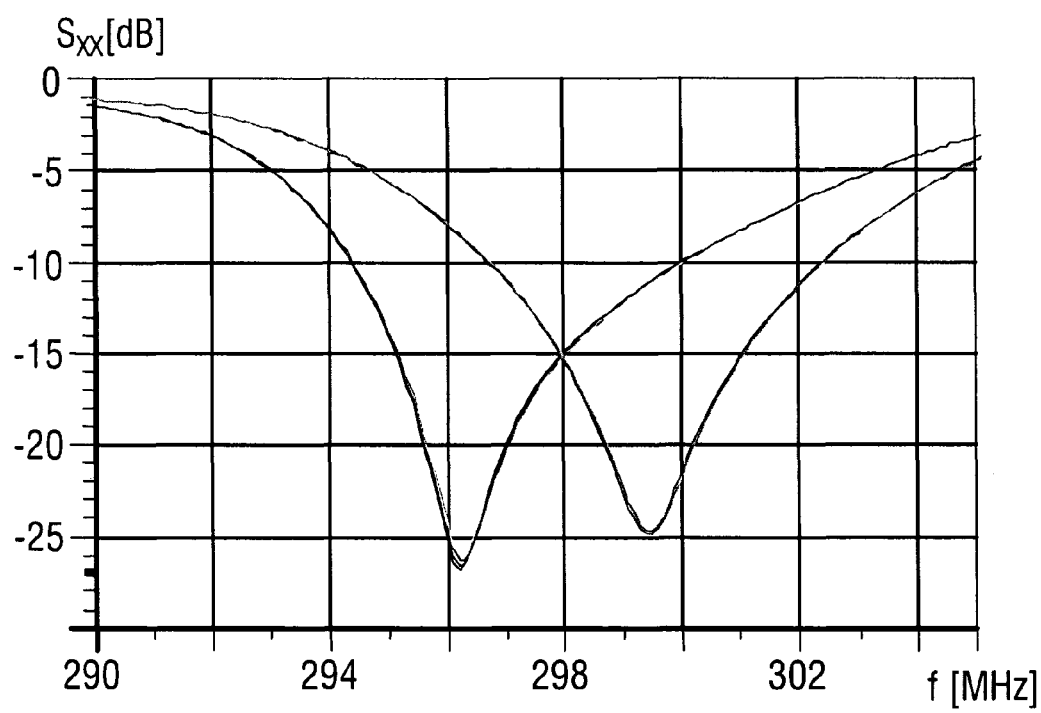
FIG. 3 shows the characteristics of the reflection coefficient $S_{XX}$ of each coil element of the MRI coil in the initial condition.

An example of $P_{ref, elem}$ data for a coil with equal value of all tune capacitors is shown in FIG. 2. Corresponding $S_{xx}$ data is presented in FIG. 3. This is a common starting condition for coil performance optimization.

Figure 4:
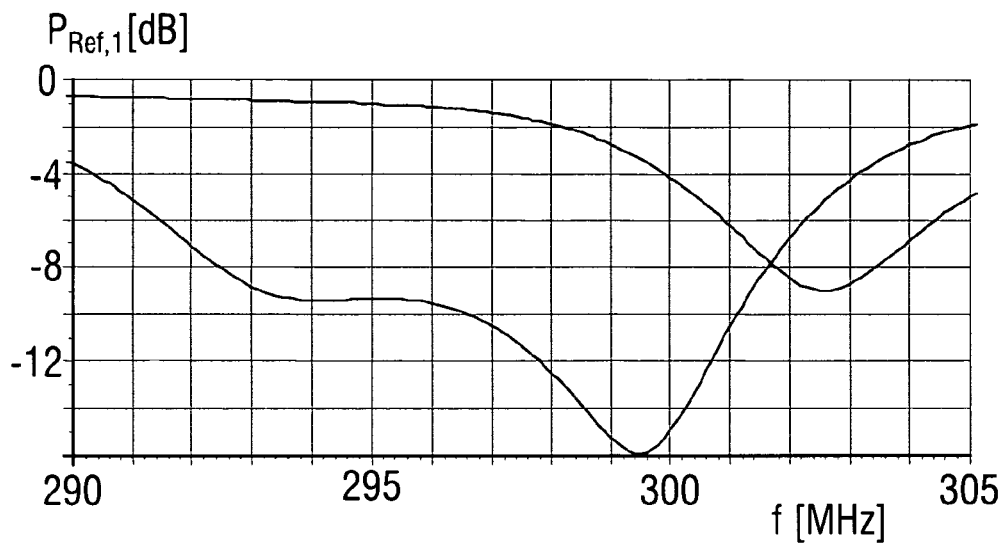
FIG. 4 shows the characteristics of the reflected power $P_{Ref,1}$ of the first element both in the initial condition and after adjusting the first tuning capacitor.
Figure 5:
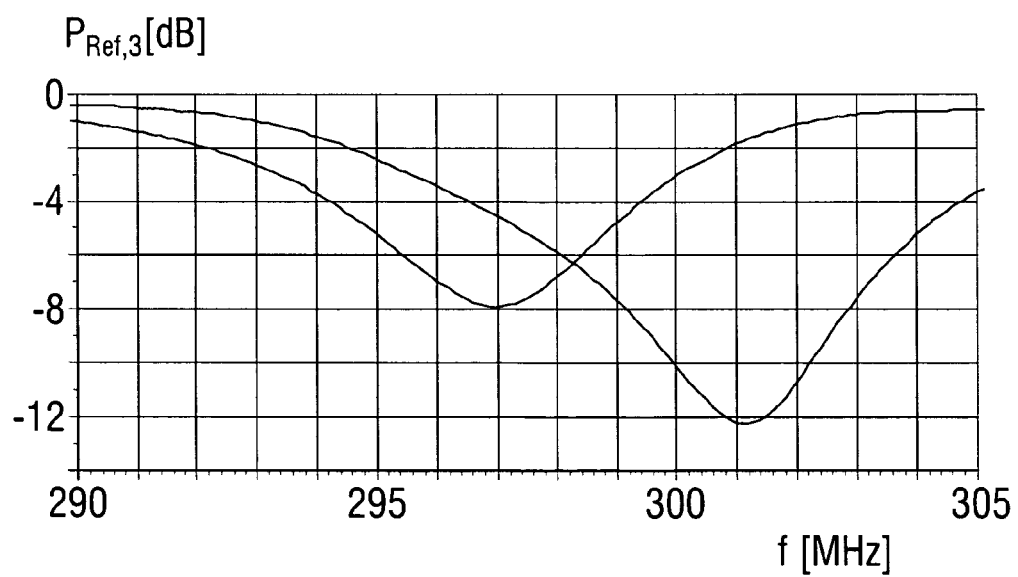
FIG. 5 shows the characteristics of the reflected power $P_{Ref,3}$ of the third coil element of the MRI coil after adjusting four tuning capacitors both in the initial condition and after adjusting four tuning capacitors.
Figure 6:
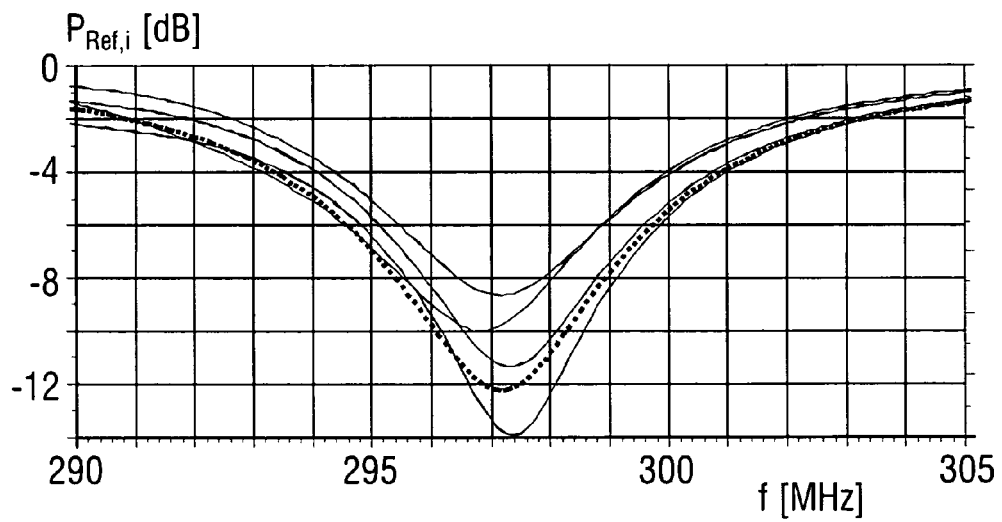
FIG. 6 shows the characteristics of the reflected power $P_{Ref,i}$ of each coil element of the MRI coil with adjusted values of all tuning capacitors.
Figure 7:
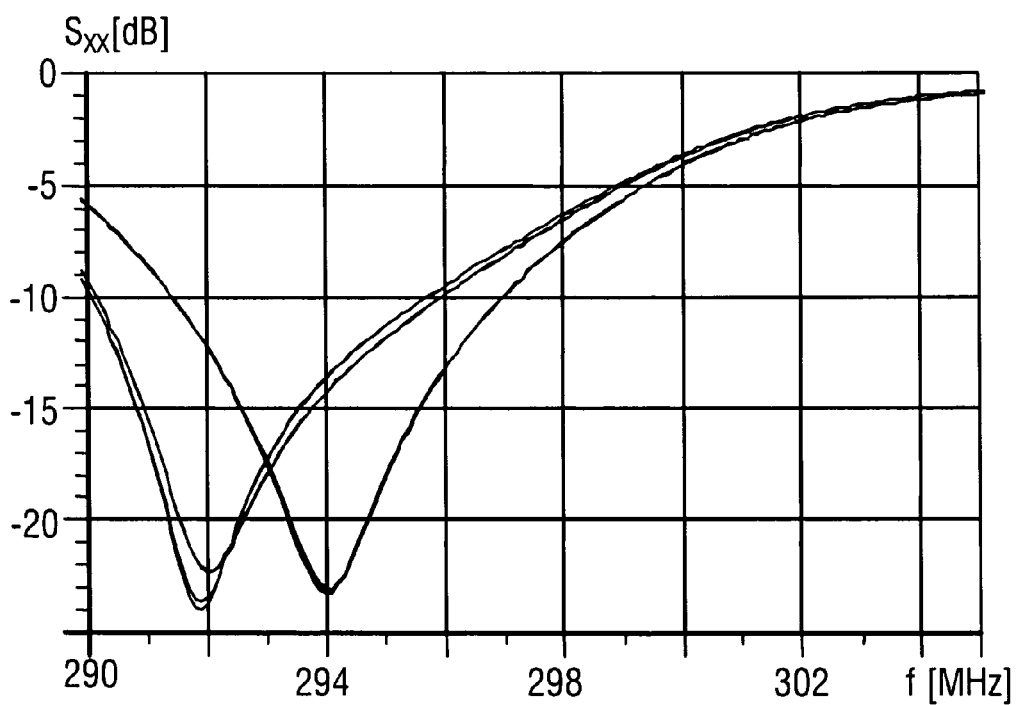
FIG. 7 shows the characteristics of the reflection coefficient $S_{XX}$ of each coil element of the MRI coil with adjusted values of all tuning capacitors.

The first step of the performance optimization procedure consists in the sequential adjustment of all tuning capacitors in order to tune the minimum of $P_{ref, elem}$ for each element to about the same frequency, by monitoring the difference between $f_{res}$ and the initial frequency at which $P_{Ref, Coil}$ approaches its minimum. FIG. 4 shows the result for $P_{ref, elem}$ of adjusting the value of the first tuning capacitor. $P_{ref, elem}$ of this first element appears to be far away from an optimal profile, but only one tuning capacitor has yet been adjusted. $P_{ref, elem}$ for the third element is shown in FIG. 5 after the similar minimization of tour tuning capacitors. When completed, this first step of performance optimization procedure has the result that $P_{Ref, Coil}$ at $f_{res}$ is equal to $-10.5$ dB. This is shown in FIG. 6. The corresponding $S_{xx}$ data is presented in FIG. 7.

Figure 8:
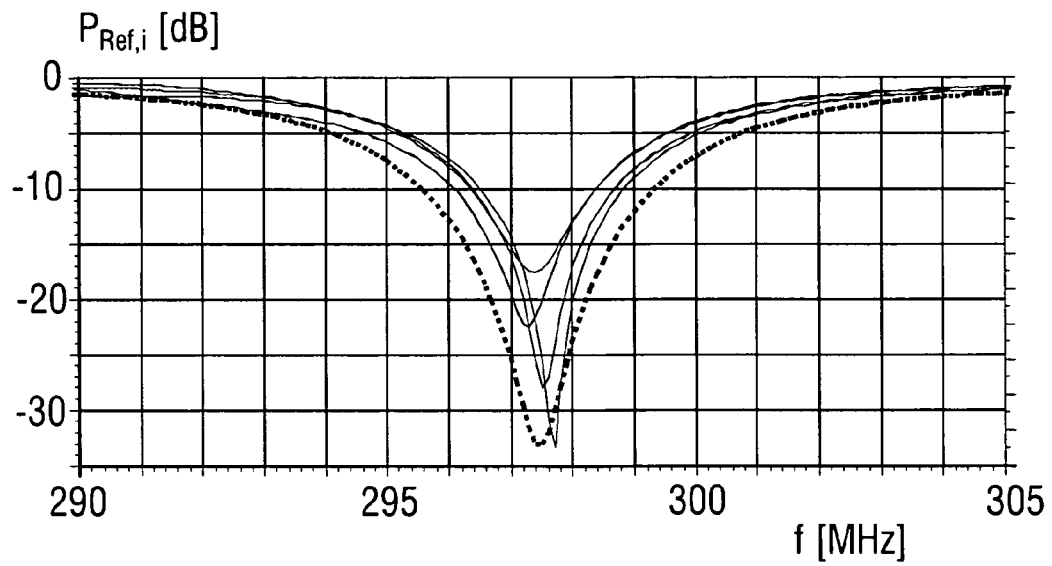
FIG. 8 shows the characteristics of the reflected power $P_{Ref,i}$ of each coil element of the MRI coil after the second optimization step.
Figure 9:
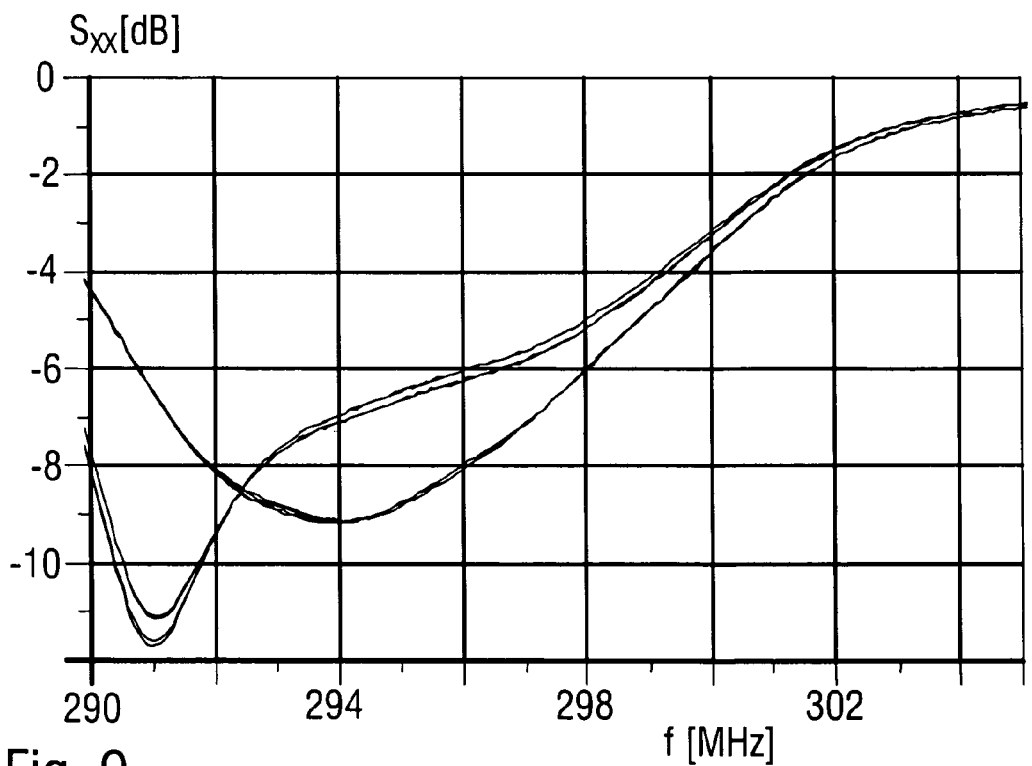
FIG. 9 shows the characteristics of the reflection coefficient $S_{XX}$ of each coil element of the MRI coil after the second optimization step.

The second step of performance optimization procedure consists in sequential adjustment of all matching capacitors to minimize $P_{ref, elem}$ at $f_{res}$. When completed, the second step has the result that $P_{Ref, Coil}$ at $f_{res}$ is equal to $-18.6$ dB. $P_{Ref, Coil}$ is presented in FIG. 8. The corresponding $S_{xx}$ data is presented in FIG. 9.

Figure 10:
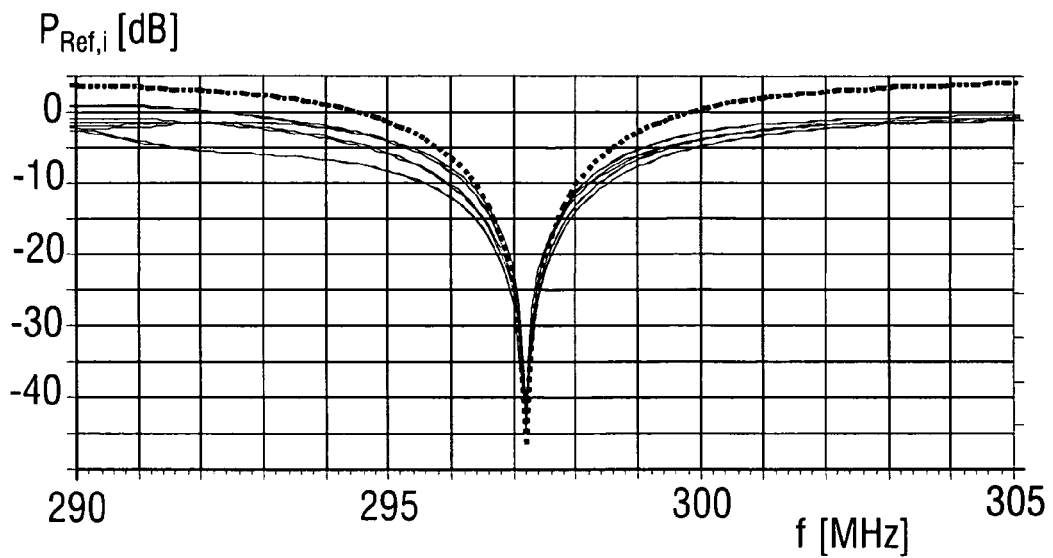
FIG. 10 shows the characteristics of the reflected power $P_{Ref,i}$ of each coil element of the coil after the third optimization step.
Figure 11:
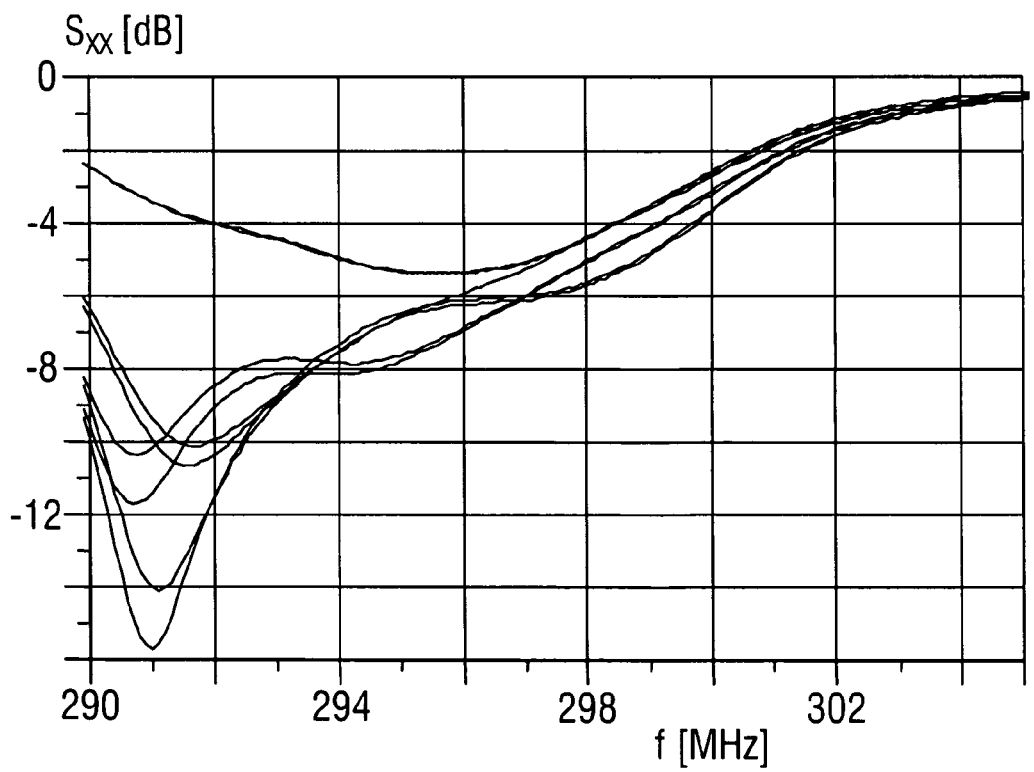
FIG. 11 shows the reflection coefficient $S_{XX}$ of each coil element of the MRI coil after the third optimization step.

The third step of the performance optimization procedure consists in sequential minor final simultaneous adjustments of all tuning and matching capacitors to minimize $P_{Ref, Coil}$ at $f_{res}$. The third step has the result that $P_{Ref, Coil}$ at $f_{res}$ is equal to $-42.1$ dB. $P_{Ref, Coil}$ is shown in FIG. 10. The corresponding $S_{xx}$ data is presented in FIG. 11.

The performance optimization procedure can be speeded up by taking into account the data regarding tuning and matching capacitor values that is provided by the 3-D EM and RF circuit co-simulation. If the coil 3-D EM model includes all construction details for the resonance elements, simulated with realistic dimensions and material electrical properties, then tuning and matching capacitor values predicted by the co-simulation are found to be very close to the actual values (cf. "The NMR phased array", l.c.).

Performance Optimization Method for Multi-Channel (Multi-Input) Near-Field Radio Frequency (RF) Coils Excited by at Least Two Power Signals with Time-Varying Amplitude and Phase The essential step of the inventive performance optimization method is the measurement of the power reflected by each individual input, and as a result the power reflected by the entire coil 1, when all coil inputs are excited by voltages with time-varying amplitude and phase.

Figure 12:
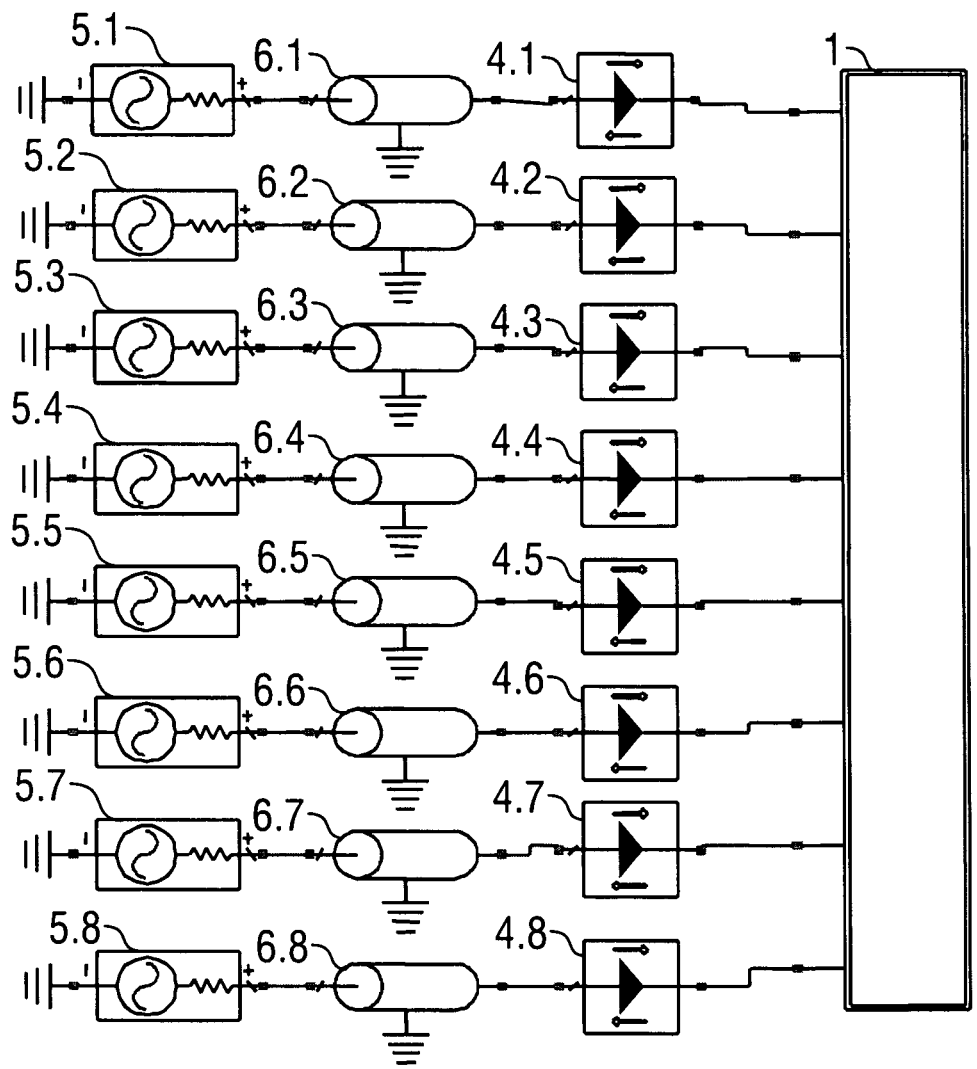
FIG. 12 shows a modification of the arrangement of FIG. 1 without a splitter for powering the multi-channel MRI coil.

In the following, the technical basis of this inventive method is described. Reference is made to FIG. 12, which schematically illustrates the optimization setup for an 8-channel MRI coil 1 excited by an 8-channel transmitter.

The embodiment of FIG. 12 corresponds to the embodiment of FIG. 1 so that the same reference numerals are used and reference is made to the above description of FIG. 1.

After the MRI coil 1 is assembled, and loaded by a phantom or a subject, the outputs of an 8-channel transmitter (in this case the four power outputs of a network analyzer split into eight channels, followed by a power amplitude and phase adjustment module remotely controlled by the network analyzer), are connected to the corresponding coil inputs, as during MRI operation. Then, eight transmit and reflected power measurement devices (in our case eight bi-directional couplers 4.1-4.8) are installed between each coil element power signal source 5.1-5.8 and the corresponding coil element inputs. The outputs of the bi-directional couplers 4.1-4.8 outputs are connected to a power measurement device (not shown), in this case to the receiver channels of a network analyzer.

In general, the scanner eight channel transmitter, which can provide safe power levels for the specific coil load, together with the MRI scanner receiver channels, can be used for the inventive method. This makes the method somewhat more complex, because the requisite software pulse sequence must be provided.

The network analyzer with multi channel sources is programmed to provide amplitude and phase for each transmit channel as well as frequency sweep measurements, at frequencies around the MRI coil operating frequency (frequencies in case of multi-nuclear MRI coil), of the ratios between $P_{Ref,\ Coil}$ and transmitted power ($P_{trans,\ coil}$) as well as each element's input reflected power and nominal (expected) transmitted power ($P_{trans,\ elem}$) for each element's input ($P_{ref,\ elem}$). This provides visual data for the minimization procedure. The nominal values and range of amplitude and phase deviation from nominal values (including probability distributions for each amplitude and phase value) is calculated based on the transmit application requirements.

Performance optimization for nominal amplitude and power values follows exactly the same procedure as for preferred embodiments of the first aspect of the invention.

As the next step, the design, with tune and feed condition thus derived, is analyzed by a Monte Carlo approach to obtain the dependence of $P_{Ref,\ Coil}$ on the amplitude and phase of the voltage applied to each input of the coil. If the histogram profiles show that there is essential difference between performances for the most frequent combinations of input power amplitude and phase and for nominal input power amplitude and phase, then the coil 1 should be retuned using one of the most frequent combinations of input power amplitude and phase as nominal condition to achieve the best average performance.

Performance Optimization Method for Multi-Channel (Multi-Input) Near-Field Radio Frequency (RF) Coils Excited by at Least Two Power Signals with Time-Varying Amplitude and Phase Using RF Circuit Simulator The essential steps of the inventive performance optimization method are the measurement of the power reflected by each individual input, and as a result the power reflected by the entire coil, when all coil inputs are excited by voltages with time-varying amplitude and phase; and obtaining S-parameter matrix for the multi-channel near-field RF coil without feed 7.1-7.8, decoupling and tune sub-circuits 8.1-8.2 by measurement with network analyzer, or by numerical simulation of the coil using a 3-D electromagnetic simulation tool with substitution by lumped ports of all feed, decoupling and tuning sub-circuits 7.1-7.8, 8.1-8.8.

Figure 13:
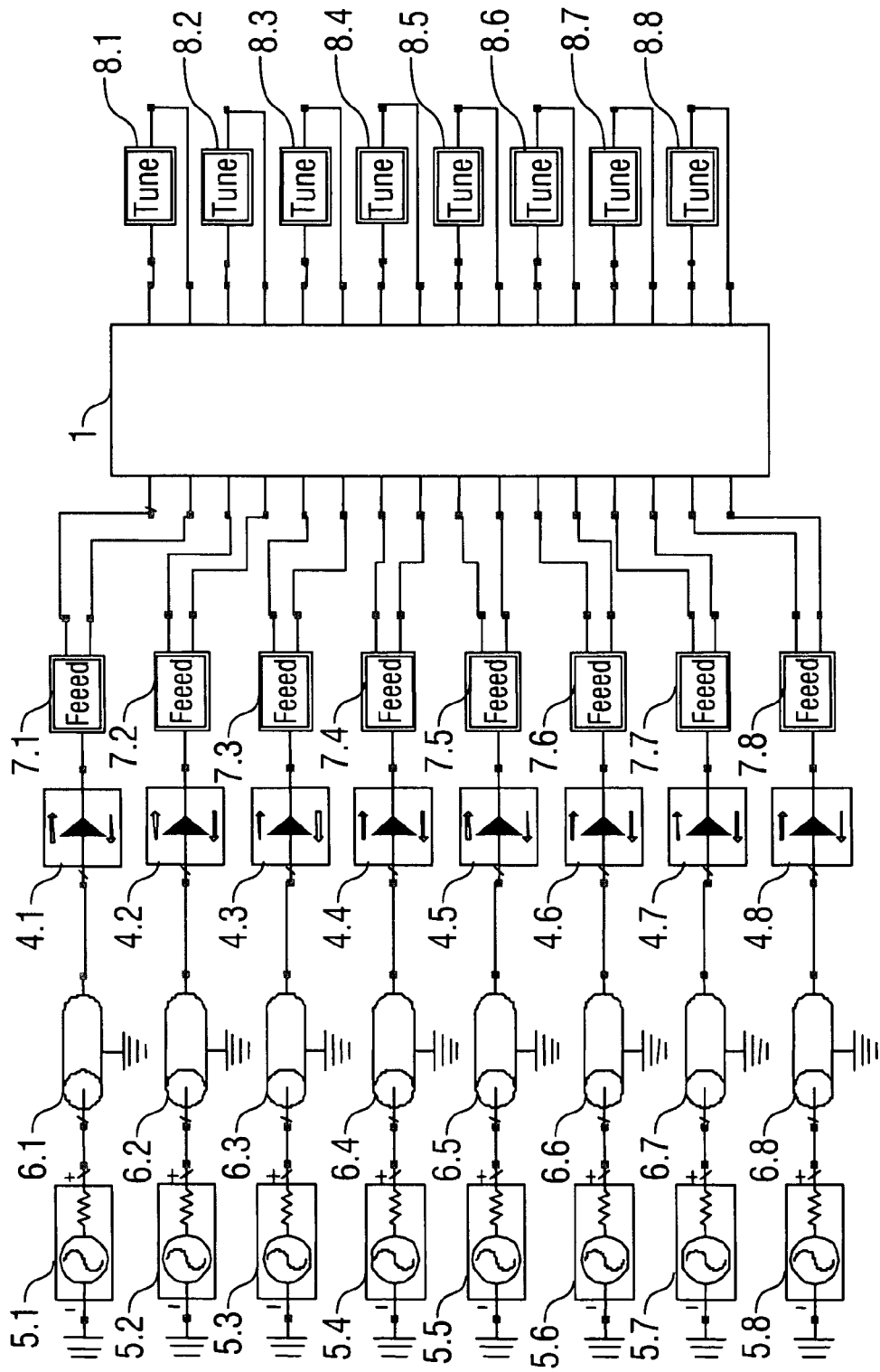
FIG. 13 shows a modification of the arrangement of FIG. 12 in a simulation tool.

In the following, the technical basis of this inventive method is described. Reference is made to FIG. 13, which schematically illustrates the optimization setup for an 8-channel MRI coil excited by an 8-channel transmitter in an RF circuit simulation tools.

As the first step, the S-parameter matrix for the multi-channel near-field RF coil without feed, decoupling and tune sub-circuits 7.1-7.8, 8.1-8.8 is obtained once only by measurement with network analyzer, or by numerical simulation of the coil using a 3-D electromagnetic simulation tool with substitution by lumped ports of all feed, decoupling and tuning sub-circuits 7.1-7.8, 8.1-8.8. If the coil 3-D EM model includes all construction details for the resonance elements, simulated with realistic dimensions and material electrical properties, then S parameter matrix predicted by the simulation are found to be very close to the actual one. As the second step, all substituted sub-circuits 7.1-7.8, 8.1-8.8 are connected to the coil S parameter matrix and the design obtained is analyzed numerically to obtain the minimum $P_{Ref,\ Coil}$ for range of amplitude and phase deviation from nominal values that is based on the transmit application requirements. This is done by a Monte Carlo based optimizing $P_{Ref,\ Coil}$ sensitivity profiles with respect to tuning condition using an RF circuit simulation tool.

In the following, reference is made to the flowchart shown in FIG. 14 for illustrating the optimization method according to the invention.

In a first step S1, the magnetic resonance imaging device is loaded with a biological object of interest or with a phantom in order to reproduce conditions of real usage during the optimization process.

In a second step S2, all individual coil elements of the multi-channel transmit coil of the MRI device are excited with power signals, wherein the power signals have the same phases and central frequencies as those to be used in practice. Further, the power signals have the same bandwidth of at least the same size. Moreover, the power signals used for exciting the MRI coil have amplitudes with the same proportion to those actually used during operation of the MRI device.

Then, the reflected power $P_{Ref,\ i}$ of the individual coil elements is simultaneously measured for all individual coil elements. It is important to note that the measurement of the reflected power takes place during a simultaneous excitation of all individual coil elements of the multi-channel transmit coil of the MRI device.

In step S4, the trim capacitors of the multi-channel transmit coil are adjusted in order to minimize the reflected power $P_{Ref,\ i}$ of each coil element individually at the resonance frequency $f_{RES}$. In other words, the adjustment of the trim capacitors is made individually for each of the coil elements.

Then, in step S5 the trim capacitors of the multi-channel transmit coil are adjusted to minimize the reflected power $P_{Ref,\ coil}$ of each entire multi-channel transmit coil at the resonance frequency.

Figure 15A:
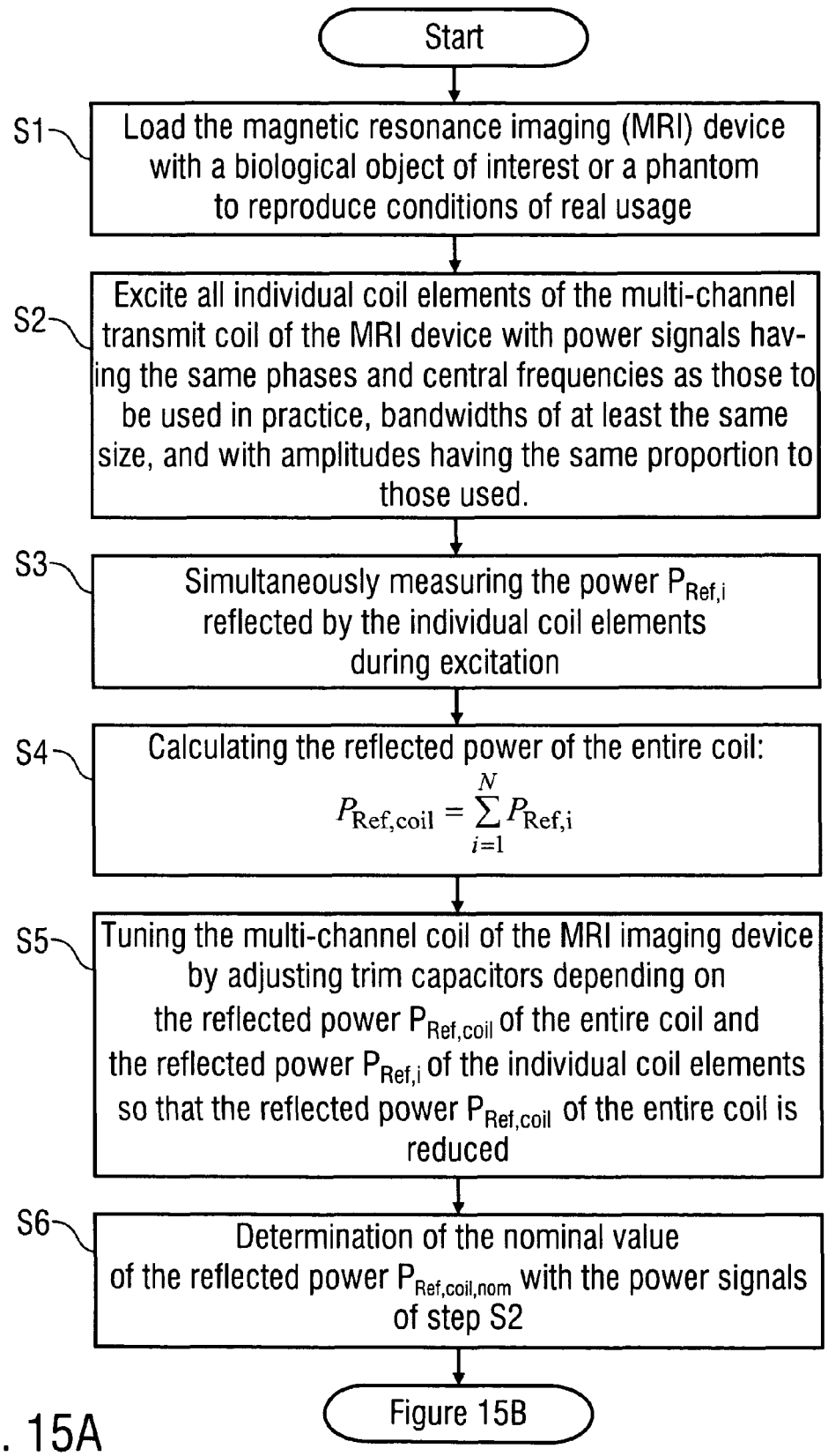
FIGS. 15A-15C show another flowchart for illustrating the optimization method according to the invention.
Figure 15B:
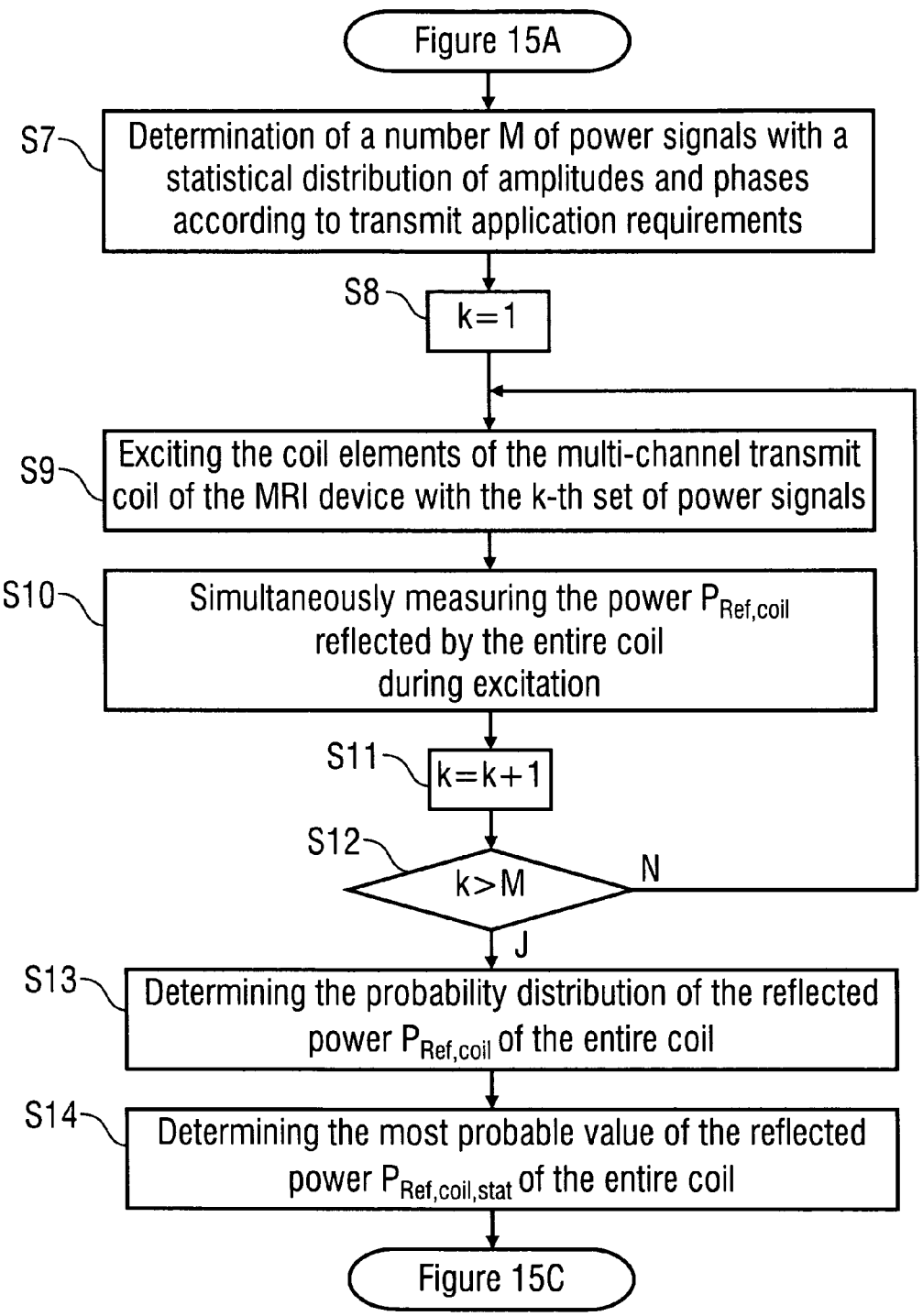
Figure 15C:
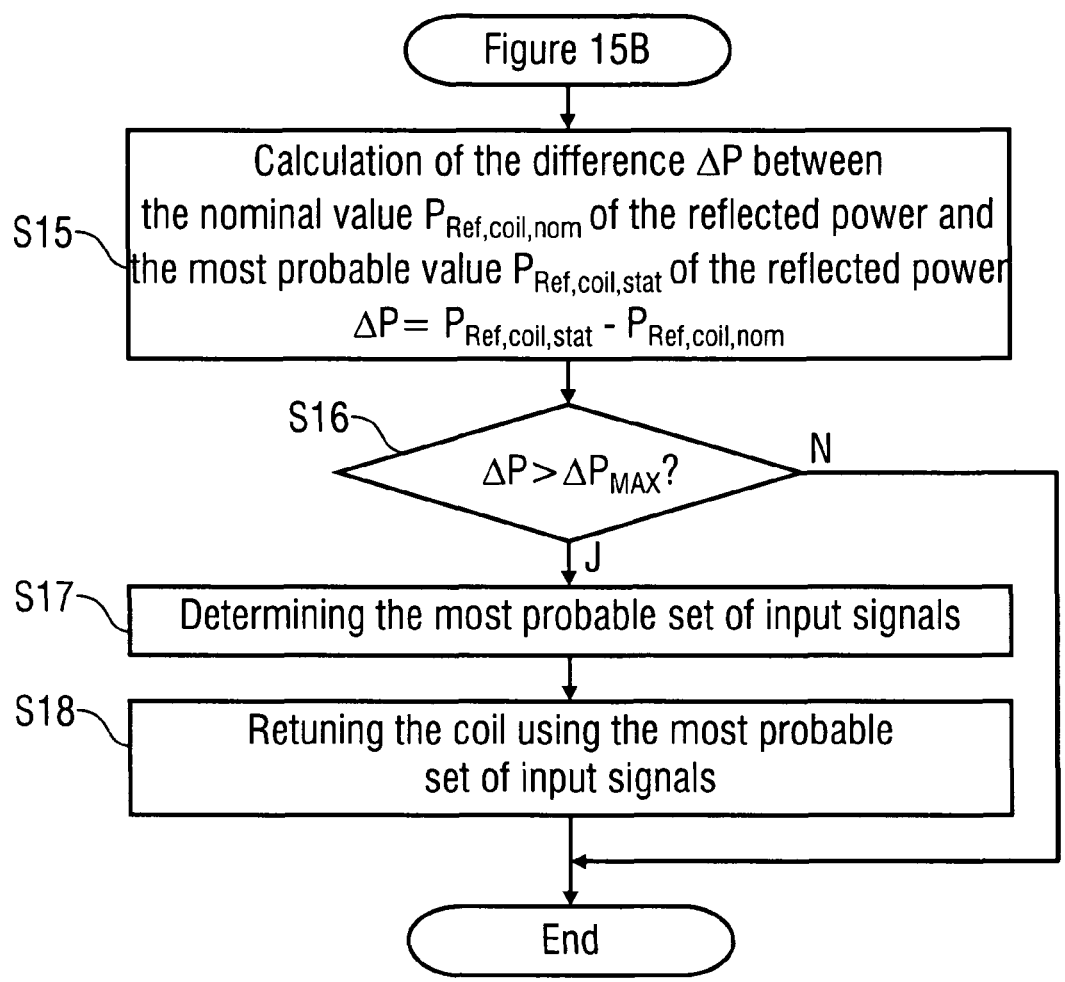

Reference now is made to FIGS. 15A-15C illustrating a two-stage optimization method according to the invention, wherein the first stage of the optimization method is shown in FIG. 15A, while the second stage of the optimization method is shown in FIGS. 15B and 15C.

Figure 14:
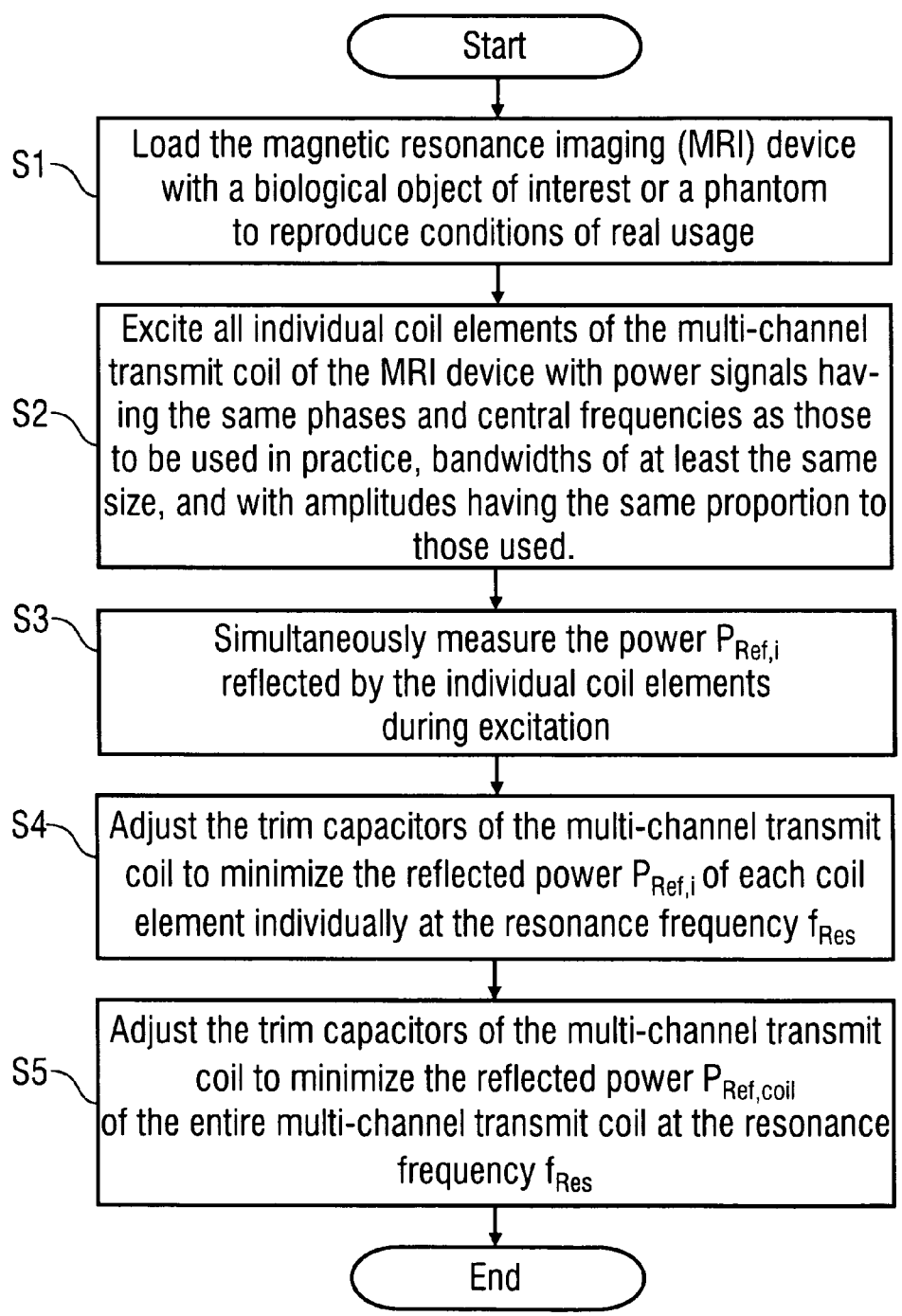
FIG. 14 shows a flowchart illustrating the optimization method according to the invention.

Steps S1-S3 of FIG. 15A correspond to steps S1-S3 of FIG. 14 so that reference is made to the above description.

In step S4 of FIG. 15A, the reflected power of the entire coil is calculated by adding the reflected power $P_{Ref,\ i}$ of the individual coil elements.

Then, in step S5 the multi-channel coil of the MRI imaging device is tuned by adjusting the trim capacitors of the multi-channel coil. Firstly, the adjustment of the trim capacitors depends on the reflected power P the entire $P_{Ref,\ coil}$ of coil. Further, the adjustment is made depending on the reflected power $P_{Ref,\ i}$ of the individual coil elements. The adjustment of the trim capacitors is made in such a way that the reflected power $P_{Ref,\ coil}$ of the entire coil is reduced.

Then, in step S6 the nominal value of the reflected power $P_{Ref,\ coil,\ nom}$ is calculated.

It should be noted that the individual coil elements of the multi-channel transmit coil are excited with power signals having the same phases and central frequencies as those to be used in practice, bandwidths of at least the same size, and with amplitudes having the same proportion to those used during the first optimization stage.

In the second stage of the optimization method, a number M of different power signals with a statistical distribution of amplitudes and phases is determined according to specific transmit application requirements.

Then, a counter k is initialized in step S8.

In a loop consisting of steps S9, S10, S11 and S12, the multi-channel coil is sequentially excited with the different sets of power signals and the reflected power $P_{Ref,\ coil}$ of the entire coil is measured.

Figure 16:
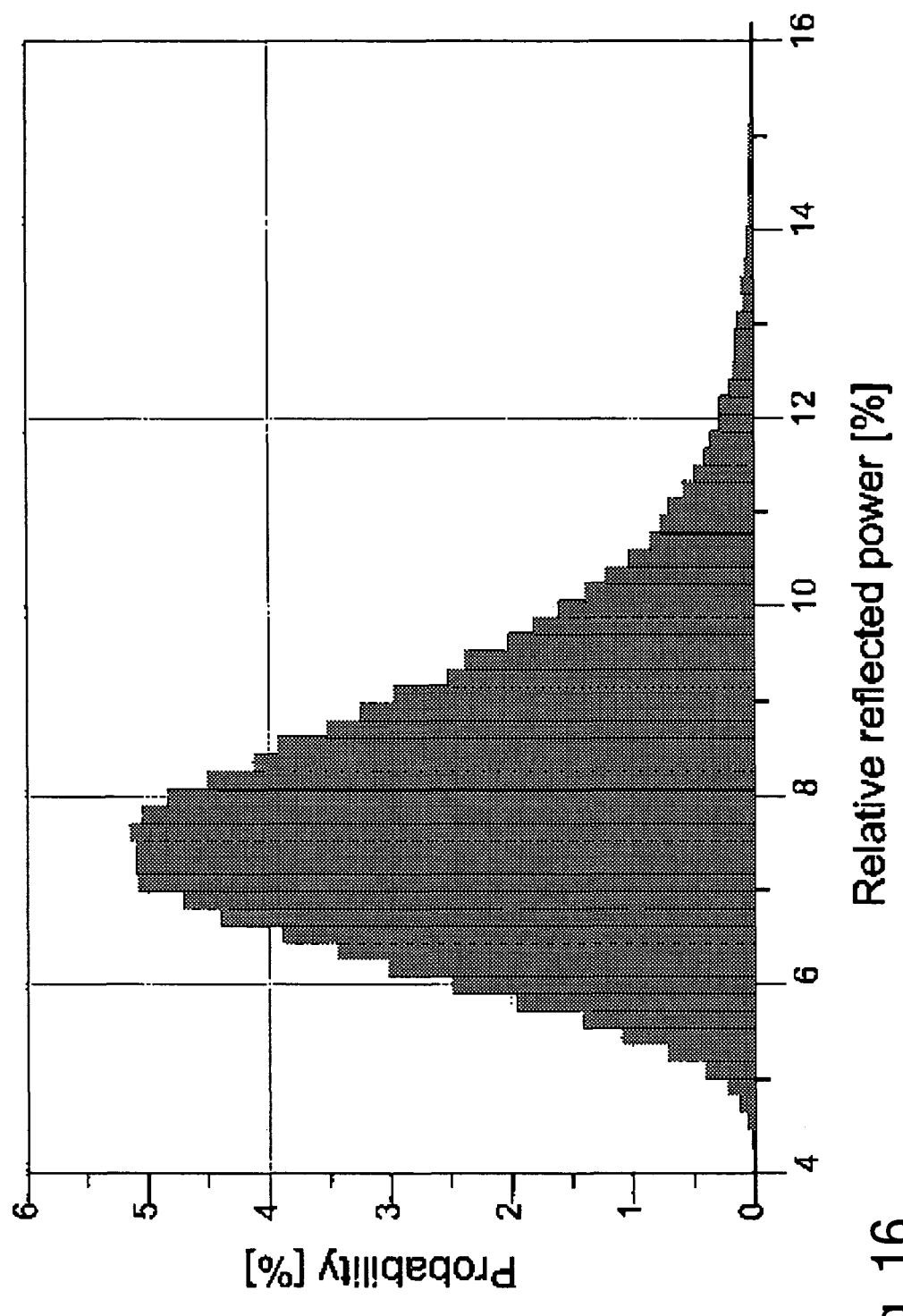
FIG. 16 shows the probability of the reflected power of the MRI coil.

In a further step S13, the probability distribution of the reflected power $P_{Ref,\ coil}$ of the entire coil is determined as shown, for example, in FIG. 16.

Then, the most probable value of the reflected power $P_{Ref,\ coil,\ stat}$ of the entire coil is determined in step S14.

In another step S15, the difference ΔP is calculated between the nominal value $P_{Ref,\ coil,\ nom}$ of the reflected power and the most probable value $P_{Ref,\ coil,\ stat}$ of the reflected power.

If the difference ΔP is smaller than a predetermined maximum value $\Delta P_{MAX}$, the tuning of the multi-channel transmit coil is acceptable.

Otherwise, the most probable set of input signals is determined in step S17 and the multi-channel transmit coil is retuned in step S18 for a further optimization of the coil.

Figure 17:
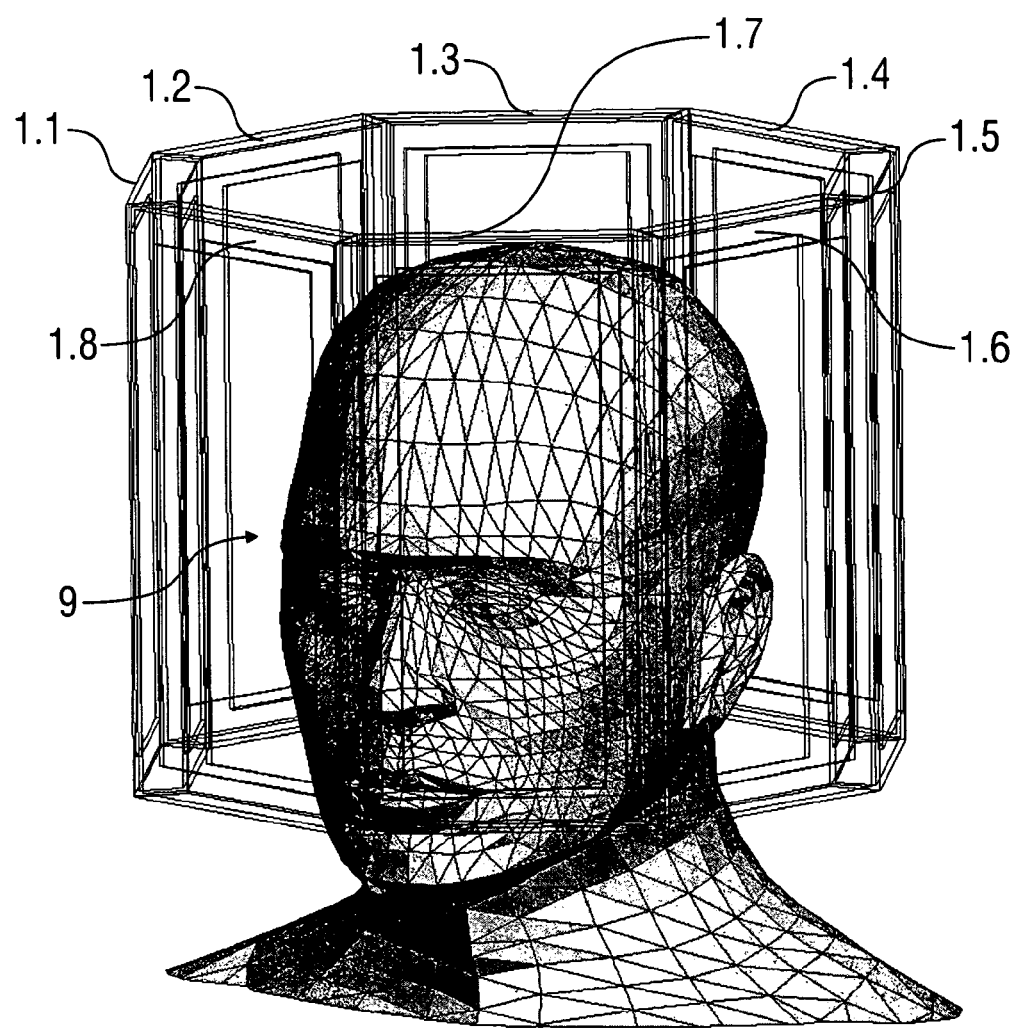
FIG. 17 schematically shows an 8-channel MRI coil surrounding the head of a human being.

Finally, FIG. 17 shows the 8-channel coil 1 comprising eight coil elements 1.1-1.8 surrounding a head 7 of a human being.

Although the invention has been described with reference to the particular arrangement of parts, features and the like, these are not intended to exhaust all possible arrangements of features, and indeed many other modifications and variations will be ascertainable to those of skill in the art.

LIST OF REFERENCE NUMERALS

1 Multi-channel transmit coil
1.1-1.8 Coil elements
2 Splitter
3.1-3.8 Phase shifters
4.1-4.8 Bi-directional couplers
5, 5.1-5.8 Power supply
6, 6.1-6.8 Transmission line
7.1-7.8 Feed
8.1-8.8 Tune sub-circuits
9 Head

The invention claimed is:

1. A method for optimization of a performance of a multi-channel coil comprising at least three coil elements, wherein the method comprises the following steps:
   a) exciting each of the coil elements of the multi-channel coil by electrical radio-frequency power signals, with each of the electrical radio-frequency power signals having a power, wherein the power of the electrical radio-frequency power signals is partially reflected by the coil elements of the multi-channel coil,
   b) measuring a reflected radio-frequency power which is reflected by each of the individual coil elements of the multi-channel coil or by the entire multi-channel coil during excitation of the coil elements,
   c) tuning the multi-channel coil depending on the measured reflected power to minimize the reflected power of each coil element or the reflected power of the entire multi-channel coil and thereby transform the multi-channel coil to a multi-channel coil with optimal performance,
   d) wherein all coil elements of the multi-channel coil are simultaneously excited, and
   e) wherein the reflected power of each coil element of the multi-channel coil and the reflected power of the entire multi-channel coil are measured during the simultaneous excitation of all coil elements of the multi-channel coil.

2. The method according to claim 1, wherein the reflected power of the individual coil elements is simultaneously measured for all coil elements of the multi-channel coil.

3. The method according to claim 1, wherein
   the reflected power is measured both for the individual coil elements of the multi-channel coil and for the entire multi-channel coil, and
   the multi-channel coil is tuned depending on the reflected power of the individual coil elements and depending on the reflected power of the entire multi-channel coil.

4. The method according to claim 1, wherein
   the multi-channel coil comprises adjustable trim elements for tuning the multi-channel coil (1), and
   the multi-channel coil is tuned by adjusting the trim elements.

5. The method according to claim 1, wherein the multi-channel coil is a transmit coil of a magnetic resonance imaging device.

6. The method according to claim 5, wherein the magnetic resonance imaging device is loaded with a phantom or a biological object before the measurement of the reflected power, wherein the phantom or biological object simulates conditions of real usage of the magnetic resonance imaging device.

7. The method according to claim 1, wherein the power signals for excitation of the individual coil elements have
   the same phases as those to be used in practice,
   the same central frequencies as those to be used in practice,
   at least the same size bandwidths as those to be used in practice, and
   amplitudes having the same relative proportions as those to be used in practice.

8. The method according to claim 7, comprising the following steps:
- minimizing the reflected power of each coil element in the multi-channel coil during a first optimization stage using power signals according to claim 7 during a first optimization stage, and then
- minimizing the reflected power of each coil element in the multi-channel coil during a second optimization stage using power signals of the individual coil elements having variable amplitudes, shapes and/or phases corresponding to transmit application requirements during the second optimization stage.

9. The method according to claim 8, wherein the power signals are varied independently for each of the coil elements of the multi-channel coil.

10. The method according to claim 8, further comprising the following steps:
- Determining a first reflected power value representing the reflected power of the entire multi-channel coil between the first optimization stage and the second optimization stage,
- Determining a second reflected power value representing the most probable reflected power of the entire multi-channel coil during the second optimization stage,
- Calculating a difference between the first reflected power value and the second reflected power value during the second optimization stage, and
- Retuning the multi-channel coil with reference to the difference between the first reflected power value and the second reflected power value during the second optimization stage, in order to minimize the reflected power of the entire multi-channel coil.

11. The method according to claim 10, wherein the first reflected power value is determined for power signals which are given
- a phase for each channel corresponding to the average phase per channel used in the transmit application, and
- amplitudes for each channel having the same relative proportion as the average amplitudes per channel used in the transmit application.

12. The method according to claim 1, comprising the following steps:
- Tuning the multi-channel coil to tune a minimum of the reflected power of all coil elements substantially at about the same frequency, and
- Tuning the multi-channel coil so that the reflected power of the entire multi-channel coil is minimized.

13. The method according to claim 1, wherein the steps of exciting, measuring and tuning are at least partially simulated.

14. A multi-channel coil which is optimized according to the method according to claim 1.

15. The method according to claim 1, wherein the reflected power of the individual coil elements is successively measured.

16. The method according to claim 1, wherein the reflected power is measured serially for several groups of the coil elements of the multi-channel coil, wherein the reflected power of the coil elements of each group is measured in parallel.

17. The method according to claim 1, wherein the multi-channel coil is a part of a medical treatment device.

* * * * *